(12) United States Patent
Jorritsma et al.

(10) Patent No.: US 10,891,933 B2
(45) Date of Patent: Jan. 12, 2021

(54) AUDIO PROCESSING SYSTEM

(71) Applicant: NXP B.V., Eindhoven (NL)

(72) Inventors: Fre Jorrit Jorritsma, Baarlo (NL); Quino Sandifort, Elst gld (NL); Albertus de Man, Elst (NL); Mattheus Johan Koerts, Arnhem (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/561,106

(22) Filed: Sep. 5, 2019

(65) Prior Publication Data
US 2020/0105243 A1 Apr. 2, 2020

(30) Foreign Application Priority Data

Oct. 1, 2018 (EP) .................................... 18198015

(51) Int. Cl.
| | |
|---|---|
| G10K 11/178 | (2006.01) |
| H03F 3/181 | (2006.01) |
| H03F 3/217 | (2006.01) |
| H04R 9/06 | (2006.01) |
| H04R 29/00 | (2006.01) |

(52) U.S. Cl.
CPC ....... *G10K 11/17823* (2018.01); *H03F 3/181* (2013.01); *H03F 3/217* (2013.01); *H04R 9/06* (2013.01); *H04R 29/001* (2013.01); *H03F 2200/03* (2013.01)

(58) Field of Classification Search
CPC ... G10K 11/17823; H04R 29/001; H04R 9/06

USPC ................................................... 381/59, 71.1
See application file for complete search history.

(56) References Cited

U.S. PATENT DOCUMENTS

| | | | |
|---|---|---|---|
| 10,506,336 B1 * | 12/2019 | Lesso | H04R 29/001 |
| 2003/0118201 A1 * | 6/2003 | Leske | H04R 3/00 |
| | | | 381/117 |
| 2006/0120541 A1 | 6/2006 | Bhandare | |
| 2011/0280415 A1 | 11/2011 | Gautama et al. | |
| 2013/0051567 A1 | 2/2013 | Gipson | |
| 2014/0140560 A1 * | 5/2014 | Melanson | H04R 3/04 |
| | | | 381/365 |
| 2015/0237428 A1 | 8/2015 | Schneider et al. | |
| 2016/0255448 A1 | 9/2016 | Morant et al. | |
| 2017/0180836 A1 | 6/2017 | Goller et al. | |
| 2017/0365272 A1 | 12/2017 | Rauschmayer | |
| 2017/0366898 A1 * | 12/2017 | Melanson | H04R 3/005 |

FOREIGN PATENT DOCUMENTS

EP 2384023 A1 11/2011

* cited by examiner

*Primary Examiner* — David L Ton

(57) ABSTRACT

An audio processing system is described including an amplifier configured to receive a first audio signal and output the first audio signal to an acoustic transducer comprising a voice coil. A sensor detects a signal corresponding to voice coil current of the acoustic transducer. A controller compares the first audio signal and the detected signal and determines a second audio signal from the comparison. The second audio signal is representative of an external sound source detected via the acoustic transducer. The audio processing system may simultaneously output the first audio signal and receive the second audio signal using the same acoustic transducer.

18 Claims, 4 Drawing Sheets

US 10,891,933 B2

AUDIO PROCESSING SYSTEM

CROSS-REFERENCE TO RELATED APPLICATIONS

This application claims the priority under 35 U.S.C. § 119 of European Patent application no. 18198015.2, filed on 1 Oct. 2018, the contents of which are incorporated by reference herein.

FIELD

This disclosure relates to an audio processing system.

BACKGROUND

Audio processing systems including active noise cancellation (ANC) typically use a number of microphones to detect the ambient noise which may then be processed by an audio amplification system. The detected noise may be used to adapt the audio signal being played via a loudspeaker to reduce the ambient noise perceived by the listener. In a car for example, an audio system may include several microphones which are distributed around the interior of the car to implement the noise cancellation function.

SUMMARY

Various aspects of the disclosure are defined in the accompanying claims. In a first aspect there is provided an audio processing system comprising: an amplifier configured to receive a first audio signal and output the first audio signal to an acoustic transducer comprising a voice coil; a sensor configured to detect a signal corresponding to a voice coil current of the acoustic transducer; a controller configured to compare the first audio signal and the detected signal and to determine a second audio signal from the comparison, wherein the second audio signal is representative of an external sound source detected via the acoustic transducer; and wherein the audio processing system is configured to simultaneously output the first audio signal and receive the second audio signal using the same acoustic transducer.

In one or more embodiments, the controller may be further configured to determine an estimated voice coil current signal from the first audio signal, a detected voice coil voltage, and model parameters of the acoustic transducer.

In one or more embodiments, the controller may be further configured to reconstruct an second audio signal from a comparison of the detected voice coil current and the estimated voice coil current.

In one or more embodiments, the controller may be further configured to: detect a voice coil voltage across the terminals of the acoustic transducer, determine an estimated voice coil current from the detected voice coil voltage, the acoustic transducer model parameters and the first audio signal; determine a resulting difference current between the estimated voice coil current and detected voice coil current; and reconstruct the second audio signal from the difference current. The second audio signal may be reconstructed from the difference current and the acoustic transducer model parameters.

In one or more embodiments, the audio processing system may comprise: an audio input configured to receive the first audio signal; an audio output configured to be coupled to the acoustic transducer; wherein the amplifier comprises an input coupled to the audio input and an output coupled to the audio output; the controller comprises a first input coupled to the audio input, a second input and a microphone signal output; and the sensor comprises an input coupled to the audio output and an output coupled to the second controller input.

In one or more embodiments, the audio output may comprise a pair of differential audio outputs, the sensor comprises a first analog-to-digital converter having a pair of inputs configured to be coupled to the terminals of an acoustic transducer and a second analog-to-digital converter configured to be coupled across a resistance arranged in series between the audio output and one of the terminals of the acoustic transducer.

In one or more embodiments, the controller may comprise: a current estimator coupled to the audio input, the sensor output and an acoustic transducer parameter memory, and an acoustic input signal reconstructor having a first input coupled to the current estimator output, a second input coupled to the sensor output, a third output coupled to the acoustic transducer parameter memory and an output coupled to the microphone signal output; wherein the current estimator is configured to determine an estimated voice coil current signal from the first audio signal, a detected voice coil voltage and model parameters of the acoustic transducer, and the acoustic input signal reconstructor is configured reconstruct the second audio signal from a comparison of the detected voice coil current and the estimated voice coil current and to output the acoustic signal on the microphone signal output.

Embodiments of the audio processing system may be included in an active noise cancelling system wherein the audio noise cancelling system is configured to use the same acoustic transducer for simultaneously outputting the first audio signal and receiving the second audio signal, wherein the second audio signal comprises ambient noise.

The active noise cancelling system may comprise an audio noise cancelling processor having a first input coupled to an audio input and a second input configured to receive the second audio input signal and an output configured to output the first audio signal.

In a second aspect there is provided a method of audio processing comprising: receiving a first audio signal and outputting the first audio signal to an acoustic transducer comprising a voice coil; detecting a signal corresponding to a voice coil current of the acoustic transducer; comparing the first audio signal and the detected signal; and determining a second audio signal from the comparison, wherein the second audio signal is representative of an external sound source detected via the acoustic transducer; wherein the first audio signal is transmitted, and the second audio signal is received simultaneously using the same acoustic transducer.

In one or more embodiments, the method may further comprise determining a second audio signal further comprises determining an estimated voice coil current signal from the first audio signal, a detected voice coil voltage and model parameters of the acoustic transducer.

In one or more embodiments, the method may further comprise reconstructing the second audio signal from a comparison of the detected voice coil current and the estimated voice coil current.

In one or more embodiments, determining the second audio signal may further comprise detecting a voice coil voltage across the terminals of the acoustic transducer, determining an estimated voice coil current from the detected voice coil voltage, the acoustic transducer model parameters and the first audio signal, determine a difference current from a difference between the estimated voice coil current and detected voice coil current, and reconstructing the second audio signal from the difference current.

In one or more embodiments, the method may be included in a method of active noise cancelling using a single acoustic transducer for simultaneously transmitting a first audio signal and detecting a second audio signal.

In a third aspect there is described a computer program product comprising instructions which, when being executed by a processing unit, cause said processing unit to perform the steps of receiving a first audio signal and outputting the first audio signal to an acoustic transducer comprising a voice coil; detecting a signal from a voice coil current of the acoustic transducer; comparing the first audio signal and the detected signal; and determining a second audio signal from the comparison, wherein the second audio signal is representative of an external sound source detected via the acoustic transducer; wherein the first audio signal is transmitted, and the second audio signal is received simultaneously using the same acoustic transducer.

BRIEF DESCRIPTION OF THE DRAWINGS

In the figures and description like reference numerals refer to like features. Embodiments of are now described in detail, by way of example only, illustrated by the accompanying drawings in which.

DETAILED DESCRIPTION OF EMBODIMENTS

Figure 1:
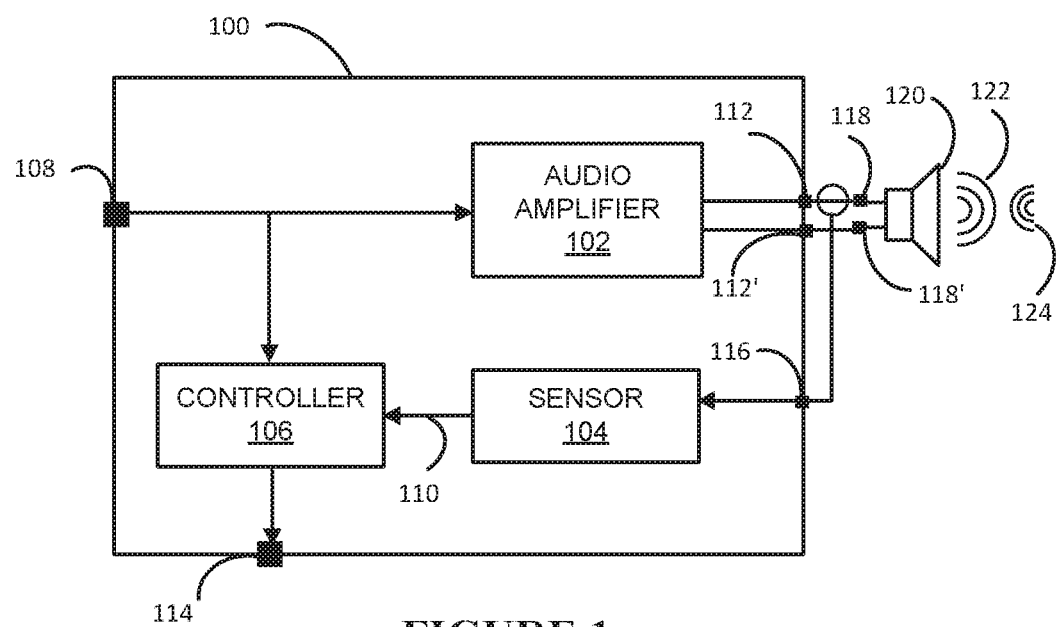
FIG. 1 Shows an audio processing system according to an embodiment.

FIG. 1 illustrates an audio processing system 100 including an audio amplifier 102, a sensor 104, and a controller 106. An audio amplifier may be any element which modifies the gain of an audio signal. In some examples the audio amplifier may be a class D amplifier. In some examples the audio amplifier may be a digital circuit or software running on a digital signal processor that modifies the value of a digital representation of an audio signal. An audio input 108 may be connected to an input of the audio amplifier 102. The audio input 108 may be connected to a first input of the controller 106. A second input of the controller 106 may be connected to an output 110 of the sensor 104. An output of the controller 106 may be connected to a microphone signal output 114. The audio amplifier 102 may have a pair of differential outputs 112, 112'. The sensor 104 may have an input 116.

In operation, the amplifier differential outputs 112, 112' may be connected to the respective first terminal 118 and second terminal 118' of a speaker 120. In other examples, the audio amplifier 102 may have a single output connected to one of the speaker terminals with the other terminal connected to ground. The sensor input 116 may be coupled to the first speaker terminal 118 In other examples, the sensor input may be coupled to the second speaker terminal 118'.

The audio amplifier 102 may receive an audio signal on audio input 108. In some examples, the audio signal may be pre-processed. The received audio signal may be amplified by the audio amplifier 102 and output on the differential audio amplifier outputs 112, 112'. The audio output signal may be converted to mechanical movement of the cone of the speaker 120 resulting in an output sound 122. Speaker 120 may be an electro dynamic loudspeaker. In other examples, the speaker may be replaced with any other acoustic transducer having a voice coil. For example a haptic actuator such as a linear resonant actuator may also be used. The sensor 104 may detect a voice coil current flowing through the voice coil of the speaker 120. It will be appreciated that the voice coil current may be detected by for example sensing the current at the output stage of the audio amplifier. Alternatively, the voice coil current may be detected by the sensor 104 measuring a voltage drop across a low value resistance which may be a few milliohms. In other examples the current sensor may be an inductance coupled to the voice coil. The sensor 104 may output a signal from the detected voice coil current on the sensor output 110. The inventors of the present disclosure have appreciated that this signal may include an external signal component which is due to acoustic environmental sound pressure 124. This external signal component may be modulated on top of the signal due to the audio output played on the speaker 120.

The controller 106 may compare the signal received from the sensor 104 with the known audio signal received via the audio input 108. The controller 106 may separate the audio signal due to the received sound from the audio signal output by the audio amplifier 102 based on the comparison. The received audio signal may be output on the microphone signal output 114. The controller 106 may determine the expected current signal from a model of the speaker 120. The behaviour of the speaker 120 may be modeled using speaker model parameters, for example Thiele small signal parameters which may either be predetermined or may be measured. Typical audio systems use these speaker model parameters to improve output sound quality.

The controller 106 may determine an estimated current through the speaker based on the audio input signal, the current flow through the speaker voice coil determined by the sensor 104, and the speaker model parameters which may be adapted from the measurement of the current and/or voltage by the sensor 104. The controller 106 may separate an acoustic input current signal due to an external acoustic source from a difference between the calculated or estimated current and the actual current determine by the sensor 104. Using the same or extended speaker parameters, the controller 106 may convert the acoustic input current signal to an audio signal which may be considered as a microphone signal.

The audio processing system 100 allows the speaker 120 or other acoustic transducer having a voice coil and connected to the audio processing system 100 to be used to simultaneously output sound and receive sound, that is to say the speaker 120 may simultaneously behave as an output loudspeaker and a microphone.

The audio processing system 100 may be included in an active noise cancellation system as part of an audio system. The audio system may require a number of speakers and microphones to implement the active noise cancellation. The audio processing system 100 may allow fewer or no microphones to be used, since the speakers may be used simultaneously to transmit and detect audio.

The audio processing system 100 may be implemented by hardware or a combination of hardware and software. For example, the audio amplifier 102 may be implemented in hardware as a class D audio amplifier or other audio amplifier. The sensor 104 and the controller 106 may be implemented by dedicated hardware or for example by a combination of software running on a digital signal processor or microcontroller including one or more analog to digital converters.

Figure 2:
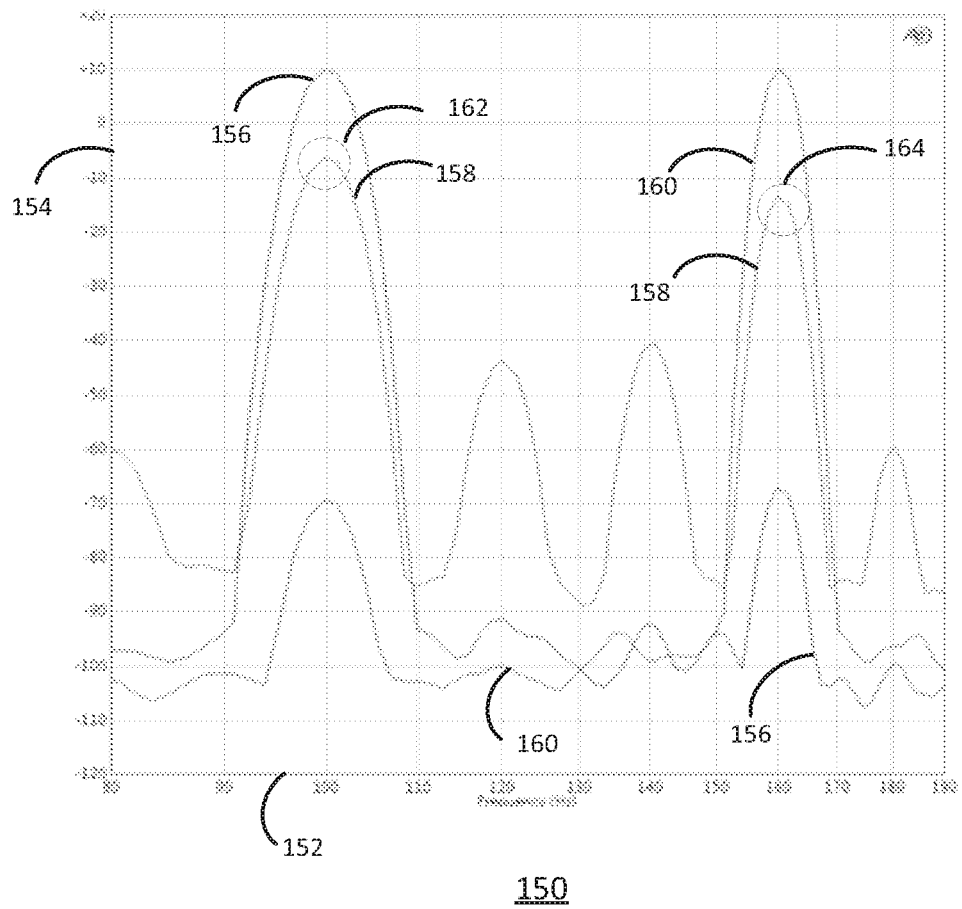
FIG. 2 Illustrates a graph showing the frequency spectrum of the signals detected in a voice coil of a loudspeaker.

FIG. 2 illustrates a graph 150 showing the frequency spectrum of the signals detected in a voice coil of a loudspeaker due to an audio output signal and an audio input signal. The test setup used to generate the signals consisted of two loudspeakers. A first loudspeaker may be considered as the loudspeaker 120 which outputs the generated audio signal. In this example, the generated audio signal is a signal of 100 Hz, −20 dBFS. A second sound source is played through a second loudspeaker which may be considered as the environmental sound source to be detected by the first loudspeaker. This second sound source in this example is a signal of 160 Hz, −20 dBFS. The graph 150 has an x-axis 152 showing the frequency range from 80 Hz 290 Hz. The y-axis 154 shows the level of current or voltage at the different frequencies ranging from −120 to +20 in units of dbA or dbV respectively.

Figure 3:
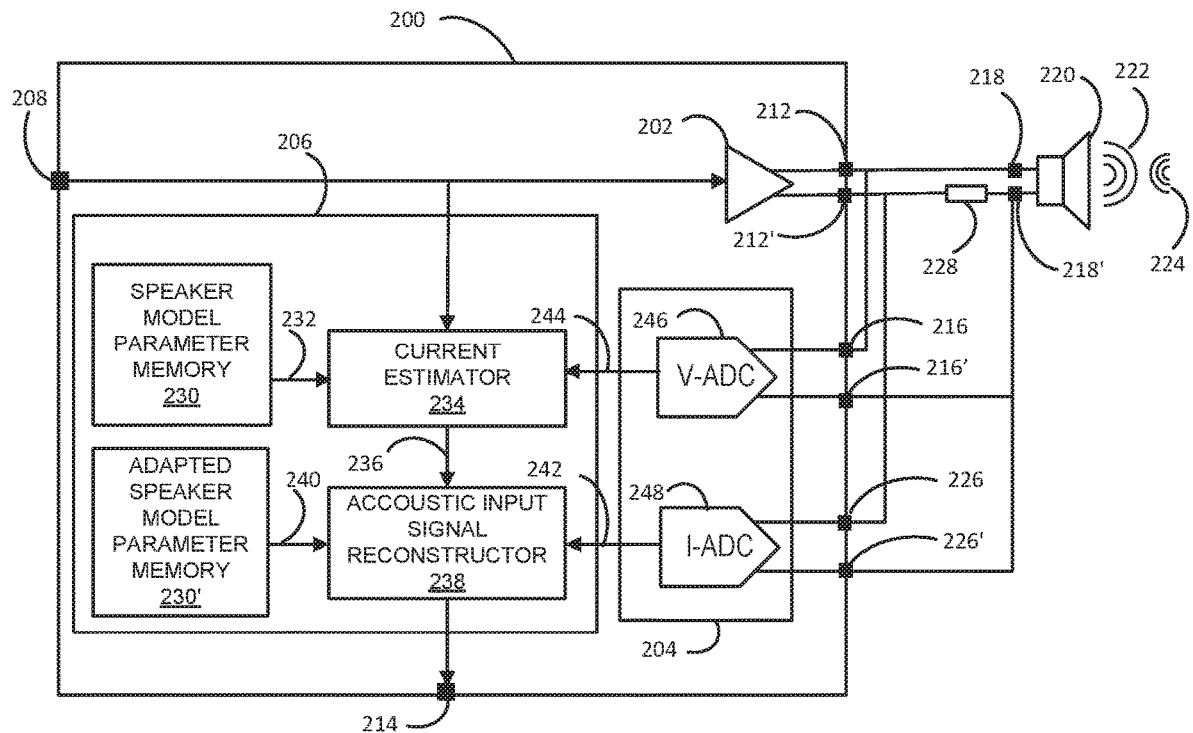
FIG. 3 Shows an audio processing system according to an embodiment.

Signal 156 shows the frequency spectrum of the voltage on the first loudspeaker. Signal 158 shows the shows the frequency spectrum of the current detected flowing in the voice coil of the first loudspeaker. Signal 160 shows the frequency spectrum of the voltage on the second loudspeaker. As can be seen, the current through the first loudspeaker shows the wanted signal of 100 Hz at a level of −6 dBA at peak 162. In addition, the current through the voice coil of the first loudspeaker shown by line 158 also shows a measure of the external generated signal of 160 Hz at a level of −14 dBA at peak 164. The intermediate peaks are an artefact of the test apparatus. Graph 150 demonstrates that by measuring the current flowing in the voice coil in a loudspeaker, a single loudspeaker maybe used to simultaneously transmit an audio signal and determine received audio signals from an external source FIG. 3 illustrates an audio processing system 200 including a class-D audio amplifier 202, a sensor 204, and a controller 206. The sensor 204 may include a voltage analog to digital converter (ADC) 246 having a pair of differential inputs 216, 216', and an output 244. The sensor 204 may include a current ADC 248 having a pair of differential inputs 226, 226' and an output 242. The controller 206 may include a current estimator 234, a speaker model parameter memory 230, an adapted speaker model parameter memory 230', and an acoustic input signal reconstructor 238. The current estimator 234 may have an input connected to an audio input 208. The current estimator 234 may have a second input connected to the voltage ADC output 244. The current estimator 234 may have a third input connected to a speaker model parameter memory output 232. The current estimator 234 may have an output 236 connected to an input of the acoustic input signal reconstructor 238. The acoustic input signal reconstructor 238 may have a second input connected to a current ADC output 242. The acoustic input signal reconstructor 238 may have a third input connected to an adapted speaker model parameter memory output 240. The acoustic input signal reconstructor 238 may have an output connected to a microphone signal output 214. The class D audio amplifier 202 may have an input connected to the audio input 208. The class D audio amplifier 202 may have a pair of differential outputs 212, 212'.

In operation, the first amplifier differential output 212, may be connected to a first speaker terminal 218. A resistance 228 may be connected between the second amplifier differential output 212' and a second speaker terminal 218'. The first voltage ADC input 216 may be connected to the first speaker terminal 218. The second voltage ADC input 216' may be connected to the second speaker terminal 218'. The first current ADC input 226 may be connected to the second amplifier differential output 212'. The second ADC input 216' may be connected to the second speaker terminal 218'.

The audio amplifier 202 may receive an audio signal on audio input 208. In some examples, the audio signal may be pre-processed. The received audio input signal may be amplified by the audio amplifier 202 and output on the differential audio amplifier outputs 212, 212'. The audio output signal may be converted to mechanical movement of the cone of the speaker 220 resulting in an output sound 222. Speaker 220 may be an electro-dynamic loudspeaker. In other examples, any other acoustic transducer having a voice coil, which may also be used to output an acoustic signal may be used. The current ADC 248 may detect a voltage drop across resistance 228 representative of the voice coil current flowing through the voice coil of the speaker 220. The voltage ADC 248 may detect a voice coil voltage across the speaker terminals 218, 218'. The sensor 204 may output a signal representing the speaker voltage on voltage ADC output 244. The sensor 204 may output a signal representing the voice coil current on ADC output 242.

The current estimator 234 may determine the expected current signal from a model of the speaker 220. The current estimator 234 may determine an estimated current through the speaker based on the received audio signal from the audio input 208, the voltage across the speaker, and the speaker model parameters from the speaker model parameter memory 230. The speaker model parameters may be adapted from the measurement of the current and/or voltage by the sensor 204. The current estimator 234 may provide the estimated current on current estimator output 236 to the acoustic input signal reconstructor 238. In some examples, an estimate of the voltage across the loudspeaker may be used from a model of the amplifier, if the gain of the amplifier is known. In this case the voltage ADC 248 may be omitted.

The acoustic input signal reconstructor 238 may determine a difference between the calculated or estimated current and the actual measured current measured by the sensor 204 and received from the current ADC output 242. This difference current signal may represent the signal due to an external acoustic source or environmental noise. Using the speaker parameters received from the adapted speaker model parameter memory 230', the controller 206 may convert the resulting difference current signal to an audio signal which may be considered to be a microphone signal. In some examples the same speaker model parameters may be used by the current estimator 234 and the acoustic input signal reconstructor 238 in which case only one speaker model parameter memory may be required.

The audio processing system 200 allows the speaker 220 or other acoustic transducer having a voice coil and connected to the audio processing system 200 to be used to simultaneously output sound and receive sound, that is to say the speaker 220 may simultaneously behave as an output loudspeaker and a microphone.

The audio processing system 200 may allow an audio system to be implemented with no separate microphones, since the speakers or other acoustic transducer may be used simultaneously to transmit and detect audio.

Figure 4:
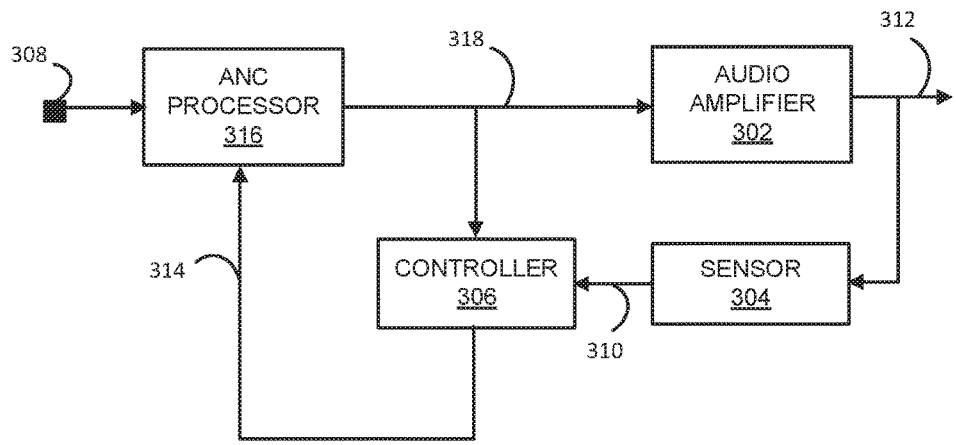
FIG. 4 Shows an active noise cancellation system according to an embodiment.

FIG. 4 illustrates an active noise cancellation system 300 including an audio amplifier 302 which may be a class-D amplifier, a sensor 304, a controller 306, and an ANC processor 316. An audio input 308 may be connected to an input of the ANC processor 316. An output 318 of the ANC processor 316 may be connected to an input of the audio amplifier 302. The ANC processor output 318 may be connected to a first input of the controller 306. A second input of the controller 306 may be connected to an output 310 of the sensor 304. An output of the controller 306 may be connected to a microphone signal output 314. The microphone signal output 314 may be connected to a second input of the ANC processor 316. The audio amplifier 302 may have an amplifier output 312. The sensor 304 may have a sensor input connected to the amplifier output 312.

In operation the amplifier output 312 is connected to loudspeaker or other acoustic transducer having a voice coil (not shown). The sensor input is consequently connected to the same loudspeaker or other acoustic transducer having a voice coil (not shown).

The ANC processor 316 may receive an audio signal on audio input 308 and output the processed audio signal on ANC output 318. The processed audio signal may be amplified by the audio amplifier 302 and output on the audio amplifier output 312. The sensor 304 may detect a voice coil current flowing through the voice coil of the speaker (not shown). The sensor 304 may output a signal corresponding to the detected voice coil current on the sensor output 310.

The controller 306 may compare the signal received from the sensor 304 with the known audio signal received from the ANC processor output 318. The controller 306 may separate the audio signal due to ambient noise from the audio signal output by the audio amplifier 302 based on the comparison. The ambient noise signal may be output on the microphone signal output 314. The ambient noise signal may be used by the ANC processor 316 to adapt the audio signal received on input 308.

The ANC system 300 allows active noise cancellation in a system without any microphones as the speaker or other acoustic transducer with a voice coil can be used to simultaneously transmit and detect audio.

Figure 5:
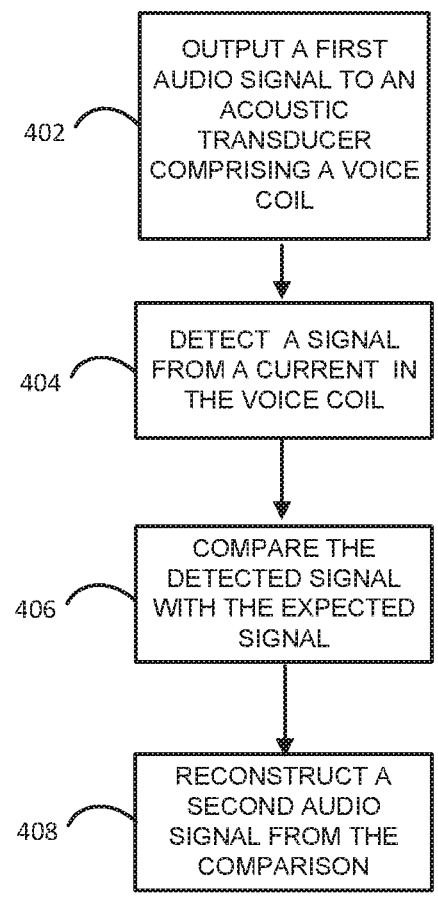
FIG. 5 shows a method of audioprocessing according to an embodiment.

FIG. 5 shows a method of audio processing 400 according to an embodiment. In step 402 a first audio signal may be output to an acoustic transducer comprising a voice coil. In step 404 a signal may be detected from a current in the voice coil. In step 406 the detected signal may be compared with the expected signal due to the audio signal which was originally provided to the acoustic transducer. In step 408 a second audio signal representing an acoustic signal input to the acoustic transducer may be reconstructed from the comparison of the detected signal and the expected signal.

Figure 6:
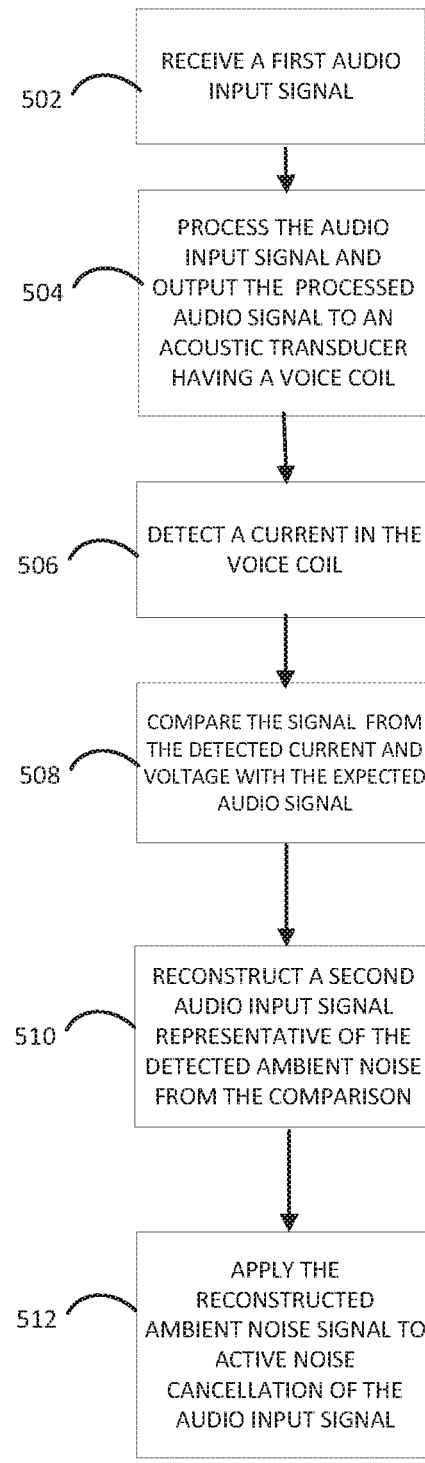
FIG. 6 Illustrates a method of active noise cancellation according to an embodiment.

FIG. 6 shows a method of active noise cancellation 500 according to an embodiment. In step 502 a first audio input signal may be received. In step 504 the first audio input signal may be processed, and the processed output signal may be sent to an acoustic transducer comprising a voice coil. In step 506 a current may be detected in the voice coil. In step 508 the signal from the detected current may be compared with the expected audio signal. In step 510 a second audio signal may be reconstructed from the comparison of the signal with the expected audio signal. The second audio signal may represent the ambient noise detected via the acoustic transducer. In step 512 the reconstructed ambient noise signal may be applied to the active noise cancellation of the first audio input signal.

Embodiments described may be included in audio systems, for example car audio systems which typically have a number of loudspeakers. Embodiments may be included in any audio system in which both audio output and audio input functions are required, and in particular where noise cancellation or echo cancellation is used, for example in conference phones, or mobile phones.

An audio processing system is described including an amplifier configured to receive a first audio signal and output the first audio signal to an acoustic transducer comprising a voice coil. A sensor detects a signal corresponding to a voice coil current. A controller compares the first audio signal and the detected signal and determines a second audio signal from the comparison. The second audio signal is representative of an external sound source detected via the acoustic transducer. The audio processing system may simultaneously output the first audio signal and receive the second audio signal using the same acoustic transducer.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

What is claimed is:

1. An audio processing system comprising:
an amplifier configured to receive a first audio signal and output the first audio signal to an acoustic transducer comprising a voice coil;
a sensor configured to detect a signal corresponding to a voice coil current of the acoustic transducer;
a controller configured to compare the first audio signal and the detected signal and to determine a second audio signal from the comparison, wherein the controller is further configured to determine an estimated voice coil current from the first audio signal, a detected voice coil voltage, and model parameters of the acoustic transducer, wherein the second audio signal is representative of an external sound source detected via the acoustic transducer; and wherein the audio processing system is configured to simultaneously output the first audio signal and receive the second audio signal using the same acoustic transducer.

2. The audio processing system of claim 1 wherein the controller is further configured to reconstruct the second audio signal from a comparison of the detected signal and the estimated voice coil current.

3. The audio processing system of claim 1 wherein the controller is further configured to:
   detect a voice coil voltage across the terminals of the acoustic transducer;
   determine an estimated voice coil current from the detected voice coil voltage, model parameters of the acoustic transducer and the first audio signal;
   determine a resulting difference current between the estimated voice coil current and detected voice coil current; and
   reconstruct the second audio signal from the difference current.

4. The audio processing system of claim 3 wherein the second audio signal is reconstructed from the difference current and the model parameters of the acoustic transducer.

5. The audio processing system of claim 1 further comprising:
   an audio input configured to receive the first audio signal;
   an audio output configured to be coupled to the acoustic transducer;
   wherein the amplifier comprises an input coupled to the audio input and an output coupled to the audio output;
   the controller comprises a first input coupled to the audio input, a second input and a microphone signal output;
   and the sensor comprises an input coupled to the audio output and an output coupled to the second controller input.

6. The audio processing system of claim 5 wherein the audio output comprises a pair of differential audio outputs, the sensor comprises a first analog-to-digital converter having a pair of inputs configured to be coupled to the terminals of an acoustic transducer and a second analog-to-digital converter configured to be coupled across a resistance arranged in series between the audio output and one of the terminals of the acoustic transducer.

7. The audio processing system of claim 5 wherein the controller comprises:
   a current estimator coupled to the audio input, the sensor output and an acoustic transducer parameter memory, and
   an acoustic input signal reconstructor having a first input coupled to the current estimator output, a second input coupled to the sensor output, a third output coupled to the acoustic transducer parameter memory and an output coupled to the microphone signal output; wherein the current estimator is configured to determine an estimated voice coil current signal from the first audio signal, a detected voice coil voltage and model parameters of the acoustic transducer, and the acoustic input signal reconstructor is configured to reconstruct the second audio signal from a comparison of the detected voice coil current and the estimated voice coil current and to output the second audio signal on the microphone signal output.

8. An active noise cancelling system comprising the audio processing system of claim 1 wherein the audio noise cancelling system is configured to use the same acoustic transducer for simultaneously outputting the first audio signal and receive the second audio signal, wherein the second audio signal comprises ambient noise.

9. The active noise cancelling system of claim 8 comprising an audio noise canceller processor having a first input coupled to an audio input, a second input configured to receive the second audio input signal and an output configured to output the first audio signal.

10. A method of audio processing comprising:
    receiving a first audio signal and outputting the first audio signal to an acoustic transducer comprising a voice coil;
    detecting a signal corresponding to a voice coil current of the acoustic transducer;
    comparing the first audio signal and the detected signal; and
    determining a second audio signal from the comparison, wherein determining the second audio signal comprises determining an estimated voice coil current from the first audio signal, a detected voice coil voltage and model parameters of the acoustic transducer, wherein the second audio signal is representative of an external sound source detected via the acoustic transducer; and
    wherein the first audio signal is transmitted, and the second audio signal is received simultaneously using the same acoustic transducer.

11. The method of claim 10 further comprising reconstructing an acoustic input signal from a comparison of the voice coil current and the estimated voice coil current.

12. The method of claim 11 wherein determining a second audio signal further comprises detecting a voice coil voltage across the terminals of the acoustic transducer, determining an estimated voice coil current from the detected voice coil voltage, the model parameters of the acoustic transducer and the first audio signal, and determining a difference current from a difference between the estimated voice coil current and the voice coil current, and reconstructing the second audio signal from the difference current.

13. The method of claim 12, wherein the second audio signal is reconstructed from the difference current and the model parameters of the acoustic transducer.

14. A method of active noise cancelling using a single acoustic transducer for simultaneously transmitting a first audio signal and detecting a second audio signal comprising the method of claim 10.

15. The method of claim 10 further comprising reconstructing the second audio signal from a comparison of the voice coil current and the estimated voice coil current, and outputting the second audio signal on the microphone signal output.

16. The method of claim 15, further comprising using an acoustic input signal reconstructor to reconstruct the second audio signal from a comparison of the detected voice coil current and the estimated voice coil current.

17. The method of claim 10, further comprising using the same acoustic transducer for simultaneously outputting the first audio signal and receiving the second audio signal, wherein the second audio signal comprises ambient noise.

18. The method of claim 10, further comprising using an audio noise canceller processor for simultaneously outputting the first audio signal and receiving the second audio signal.

* * * * *